(12) United States Patent
Lin et al.

(10) Patent No.: US 8,574,940 B2
(45) Date of Patent: Nov. 5, 2013

(54) METHOD OF MAKING A FLEXIBLE OPTOELECTRONIC DEVICE HAVING INVERTED ELECTRODE STRUCTURE

(71) Applicant: National Taiwan University, Taipei (TW)

(72) Inventors: Ching-Fuh Lin, Taipei (TW); Kao-Hua Tsai, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/743,930

(22) Filed: Jan. 17, 2013

(65) Prior Publication Data

US 2013/0130423 A1   May 23, 2013

Related U.S. Application Data

(62) Division of application No. 12/612,670, filed on Nov. 4, 2009, now Pat. No. 8,378,337.

(30) Foreign Application Priority Data

Aug. 11, 2009 (TW) ................................ 98126975 A

(51) Int. Cl.
*H01L 51/00* (2006.01)
(52) U.S. Cl.
USPC .......................................................... 438/46

(58) Field of Classification Search
USPC ............ 257/40, 43, 53, E51.028; 438/99, 22
See application file for complete search history.

(56) References Cited

U.S. PATENT DOCUMENTS

| 7,719,001 B2* | 5/2010 | Nomura et al. .................. 257/40 |
| 2008/0006820 A1* | 1/2008 | Schols et al. ..................... 257/40 |
| 2008/0142079 A1* | 6/2008 | Ting et al. ..................... 136/263 |

FOREIGN PATENT DOCUMENTS

| EP | 1919008 A2 | 5/2008 |
| TW | M330563 | 4/2008 |

* cited by examiner

*Primary Examiner* — Zandra Smith
*Assistant Examiner* — Paul E. Patton
(74) *Attorney, Agent, or Firm* — Stout, Uxa, Buyan & Mullins, LLP

(57) ABSTRACT

A flexible optoelectronic device having inverted electrode structure is disclosed. The flexible optoelectronic device having inverted electrode structure includes a flexible plastic substrate having a cathode structure, an n-type oxide semiconductor layer, an organic layer, and an anode. The n-type oxide semiconductor layer is disposed on the cathode structure. The organic layer is disposed on the n-type oxide semiconductor layer. The anode is electrically connected with the organic layer.

15 Claims, 13 Drawing Sheets

METHOD OF MAKING A FLEXIBLE OPTOELECTRONIC DEVICE HAVING INVERTED ELECTRODE STRUCTURE

CROSS-REFERENCE TO RELATED APPLICATIONS

The present invention is a divisional of U.S. patent application Ser. No. 12/612,670, filed on Nov. 4, 2009 and entitled "FLEXIBLE OPTOELECTRONIC DEVICE HAVING INVERTED ELECTRODE STRUCTURE AND METHOD FOR MAKING THE SAME," which claims the priority benefit of Taiwan Patent Application No. 098126975, filed on Aug. 11, 2009, the complete subject matter of both which are hereby incorporated herein by reference.

BACKGROUND OF THE INVENTION

1. Field of the Invention

The present invention generally relates to a flexible optoelectronic device, and more particularly to a flexible optoelectronic device having an inverted electrode structure and method for making the same.

2. Description of Related Art

Organic optoelectronic devices, such as organic solar cells (OSC), organic light emitting diodes (OLED), organic light sensors, and so on, have many advantages. For example, organic optoelectronic devices can be lightweight, thin, large-area, flexible, and low-cost devices.

FIG. 1 shows a conventional flexible optoelectronic device 100. For example, the flexible optoelectronic device 100 can be a solar cell. The flexible optoelectronic device 100 includes a flexible conductive substrate 110, an electrode 160, and an organic layer 130. The flexible conductive substrate 110 includes a transparent electrode 112, a mask layer 113, and flexible plastic material 111. The transparent electrode 112 is used as an anode. The flexible plastic material 111 can be polyethylene terephthalate (PET). The transparent electrode 112 and the mask layer 113 are disposed on the two (e.g., opposing) sides of the flexible plastic material 111 respectively. Light 10 is able to reach the organic layer 130 through the opening 115 of the mask layer 113. In order to increase the power conversion efficiency of the flexible optoelectronic device 100, a hole transporting layer 140 can be disposed between the organic layer 130 and the transparent electrode 112. For example, poly(3,4-ethylenedioxythiophene) poly(styrenesulfonate) (PEDOT/PSS) can be used as the material of hole transporting layer 140, so as to increase the power conversion efficiency.

However, PEDOT is corrosive for the transparent electrode 112, and may result in damage to the optoelectronic device 100. Thus, the performance of the flexible optoelectronic device 100 may decay very quickly.

For the mentioned disadvantages of the prior art, a need has arisen to propose a novel flexible optoelectronic device with higher power conversion efficiency and without rapid performance decay.

SUMMARY OF THE INVENTION

Accordingly, the present invention has been made in order to meet such a need described above, whereby an object of the present invention is to provide a flexible optoelectronic device that has higher power conversion efficiency.

It is another object of the present invention to provide a flexible optoelectronic device without rapid performance decay.

In order to achieve the above objects, the present invention provides a flexible optoelectronic device having inverted electrode structure. The flexible optoelectronic device with inverted electrode structure includes a flexible plastic substrate having a cathode structure, an n-type oxide semiconductor layer, an organic layer, and an anode. The n-type oxide semiconductor layer is disposed on the cathode structure. The organic layer is disposed on the n-type oxide semiconductor layer. The anode is electrically connected with the organic layer.

The present invention also provides a method for making a flexible optoelectronic device having inverted electrode structure. The method includes providing a flexible plastic substrate having a cathode structure; forming an n-type oxide semiconductor layer on the cathode structure; forming an organic layer on the n-type oxide semiconductor layer; and forming an anode on the organic layer.

DETAILED DESCRIPTION OF THE INVENTION

A detailed description of the present invention will now be provided in the context of the following embodiments, which are not intended to limit the scope of the present invention and which can be adapted for other applications. While drawings are illustrated in detail, it is appreciated that the quantity of the disclosed components may be greater or less than that disclosed, except for instances expressly restricting the amount of the components.

Figure 1:
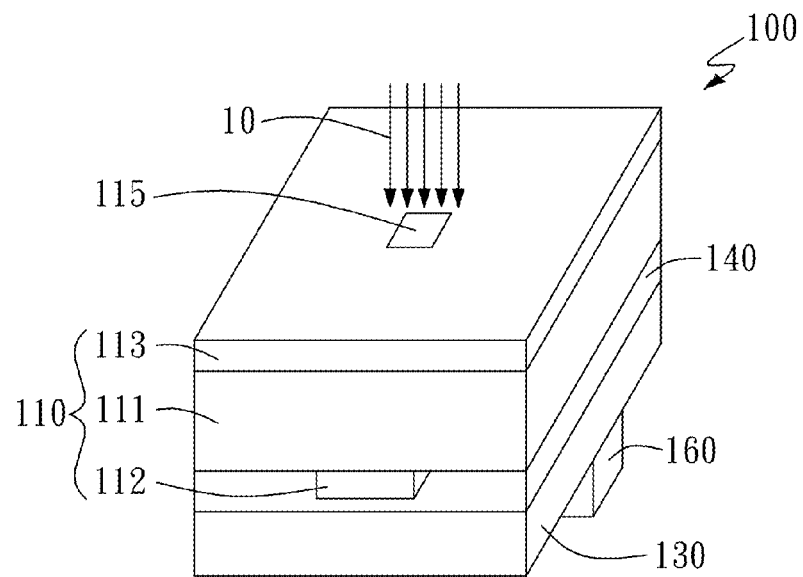
FIG. 1 shows a conventional flexible optoelectronic device.
Figure 2:
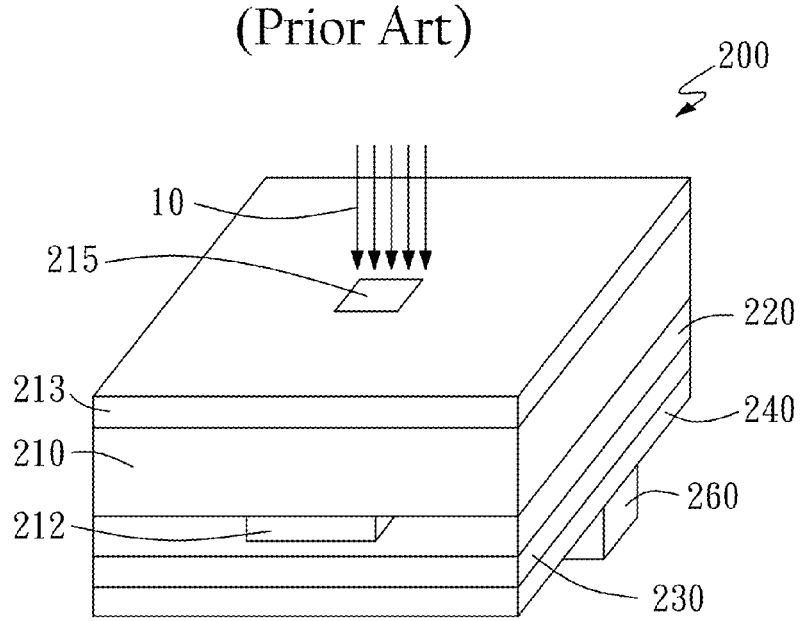
FIG. 2 shows the sectional view of a flexible optoelectronic device having inverted electrode structure in accordance with an embodiment of the present invention.

FIG. 2 shows the sectional view of a flexible optoelectronic device having inverted electrode structure 200 in accordance with an embodiment of the present invention. The flexible optoelectronic device 200 includes a flexible plastic substrate 210, an n-type oxide semiconductor layer 220, an organic layer 230, and an anode 260. The flexible plastic substrate 210 has a cathode structure 212. The n-type oxide semiconductor layer 220 is disposed on the cathode structure 212. The organic layer 230 is disposed on the n-type oxide semiconductor layer 220. The cathode 260 is electrically connected with the organic layer 230.

With different materials and different structures, the flexible optoelectronic device 200 can be a solar cell, a light-emitting diode, or a light sensor. In order to increase the power conversion efficiency of the flexible optoelectronic device 200, a hole transporting layer 240 can be disposed between the organic layer 230 and the cathode 260. The flexible plastic substrate 210 can further include a mask layer 213. Light 10 is able to reach the organic layer 230 through the opening 215 of the mask layer 213.

Figure 3:
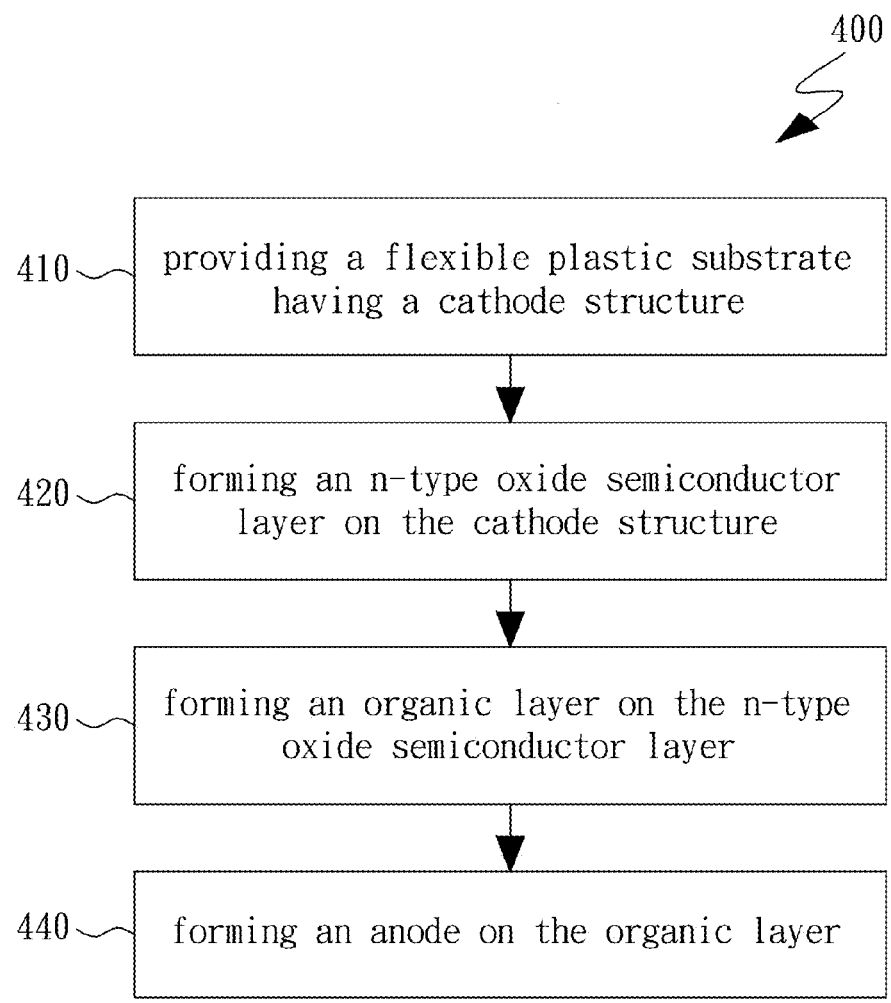
FIG. 3 shows the flow diagram of a method of making a flexible optoelectronic device in accordance with an embodiment of the present invention.

FIG. 3 shows the flow diagram of a method 400 of making a flexible optoelectronic device in accordance with an embodiment of the present invention. The method 400 includes the following steps: step 410, providing a flexible plastic substrate having a cathode structure; step 420, forming an n-type oxide semiconductor layer on the cathode structure; step 430, forming an organic layer on the n-type oxide semiconductor layer; step 440, forming an anode on the organic layer.

Figure 4A:
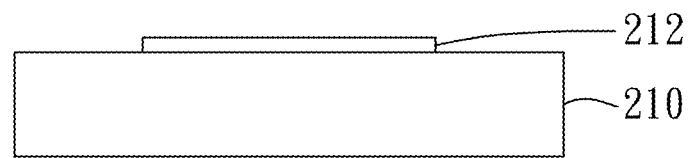
FIGS. 4A-4E show the steps of making the flexible optoelectronic device having inverted electrode structure.

FIGS. 4A-4E show the steps of making the flexible optoelectronic device having inverted electrode structure 200. Referring to FIG. 4A, a conductive substrate 210 is provided. The conductive substrate 210 has a cathode structure 212. The material of the cathode structure 212 can be indium tin oxide (ITO), aluminum-doped zinc oxide (AZO), gallium-doped zinc oxide (GZO), or other conductive material. The conductive substrate 210 can be cleaned by an ultrasonic agitation process which uses deionized water, acetone, and isopropanol.

In this embodiment, the material of the flexible plastic substrate 210 is polyethylene terephthalate (PET), but is not limited to this. The material of the flexible plastic substrate 210 can be another plastic material, such as polycarbonates (PC), PEN, polyethersulfone (PES), polyetherimide (PEI), polyimide (PI), Metallocene based Cyclic Olefin Copolymer (mCOC), and their derivatives.

Figure 4B:
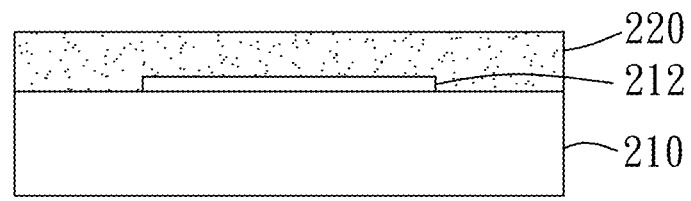

Referring to FIG. 4B, an n-type oxide semiconductor layer 220 is formed on the cathode structure 212. The material of the n-type oxide semiconductor layer 220 can be at least one material or any combination selected from the group consisting of zinc oxide, titanium oxide, tungsten oxide, and so on. The material of the n-type oxide semiconductor layer 220 can also be a mixture, such as a mixture which is composed of zinc oxide and titanium oxide according to an appropriate proportion.

The n-type oxide semiconductor layer 220 mentioned above can be formed on the cathode structure 212 by a sol-gel method. The forming method includes the following steps: providing a precursor solution having n-type transition metal oxide; performing a coating process for coating the precursor solution on the surface of the cathode structure 212; performing a sol-gel process for forming an n-type oxide semiconductor layer 220 on the cathode structure 212 from the precursor solution; finally, performing a first annealing treatment on the n-type oxide semiconductor layer 220.

In this embodiment, the material of the n-type oxide semiconductor layer 220 is zinc oxide. The precursor solution includes zinc acetate solution, 2-methoxyethanol, and ethanolamine. The concentration of the precursor solution is about 0.01M-10M. The temperature of the first annealing treatment is preferably about 140° C. The concentrations of the precursor solution and the temperature of the first annealing treatment are not limited. With the different material(s) of the n-type oxide semiconductor layer 220, the appropriate concentration(s) of the precursor solution and the appropriate temperature(s) of the first annealing treatment will be different.

The n-type oxide semiconductor layer 220 mentioned above can also be formed on the cathode structure 212 by a physical vapor deposition (PVD) process, wherein the physical vapor deposition (PVD) includes thermal evaporation, electron beam evaporation, and magnetron sputtering. Furthermore, the n-type oxide semiconductor layer 220 mentioned above can also be formed on the cathode structure 212 by way of a solution method. The forming method includes the following steps: providing a suspension having a plurality of micro/nano n-type transition metal oxide structures; performing a coating process for coating the suspension on the surface of the cathode structure 212 for forming an n-type oxide semiconductor layer 220 on the cathode structure 212. The n-type oxide semiconductor layer 220 is composed of stacked micro/nano n-type transition metal oxide structures. The coating process can include one or more of spin coating, jet printing, screen printing, contact coating, dip coating, and roll-to-roll printing.

Compared with the sol-gel method, there is no need to apply an annealing treatment on the n-type oxide semiconductor layer formed by the solution method. The crystal state of the n-type oxide semiconductor layer is the same as the crystal state of the micro/nano transition metal oxide structures. Thus, there is no need to apply an annealing treatment on the n-type oxide semiconductor layer. The micro/nano transition metal oxide structures can be formed in single crystal state, polycrystal state, or amorphous state.

In this embodiment, each ml of the suspension preferably includes 0.01-100 mg of the micro/nano n-type transition metal oxide structures, but is not limited to this. With the different material of the n-type oxide semiconductor layer 220, the appropriate concentration of the suspension may vary.

Figure 4C:
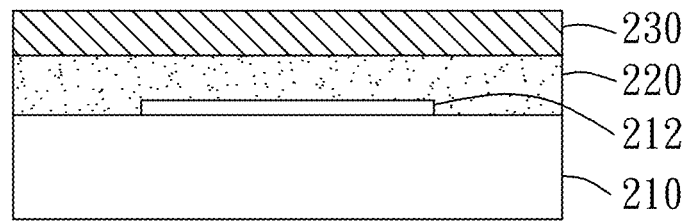

Referring to FIG. 4C, an organic layer 230 is formed on the n-type oxide semiconductor layer 220. In this embodiment, an organic solution is coated on the n-type oxide semiconductor layer 220 by spin coating. The solvent of the organic solution is dichlorobenzene. Thus, an organic layer 230 having thickness of about 200 nm is formed. The organic solution mentioned above includes polythiophene or its derivative. For example, the organic solution mentioned above includes 20 mg/ml of poly[3-hexylthiophene-2,5-diyl] and 20 mg/ml of [6,6]-phenyl C61 butyric acid methyl ester (P3HT/PCBM), but is not limited to this. Additionally, the material of the organic layer 230 can be other materials, such as: Plexcore® PV 2000 or other similar organic material(s).

Figure 4D:
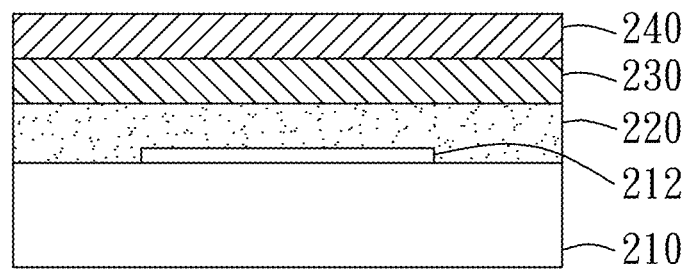
Figure 4E:
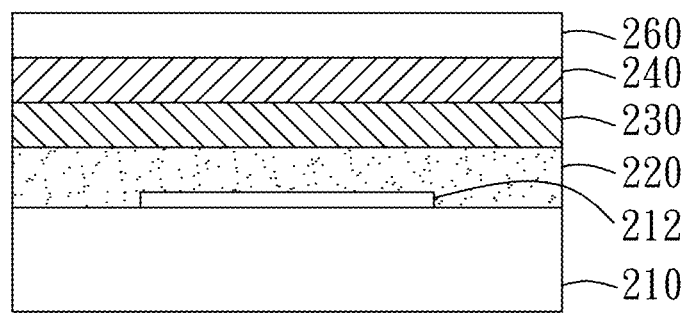

Referring to FIG. 4D, in order to increase the power conversion efficiency of the flexible optoelectronic device 200, a hole transporting layer 240 can be selectively formed on the organic layer 230. The step of forming hole transporting layer 240 can be skipped in some cases. The hole transporting layer can be a p-type oxide semiconductor or a p-type polymer material, wherein the p-type oxide semiconductor can include at least one material or any combination selected from vanadic oxide, silver oxide, nickel oxide, molybdenum oxide, and copper oxide. Finally, referring to FIG. 4E, a cathode 260 is formed. The cathode 260 is electrically connected with the organic layer 230. In this embodiment, the cathode 260 is formed by thermal evaporation. The material of the cathode 260 is silver.

According to this embodiment, a second annealing treatment can be selectively performed after the thermal evaporation of the cathode 260. The second annealing treatment can be skipped in some cases. In one example of this embodiment, when the material of the organic layer 230 includes polythiophene or its derivative, the flexible optoelectronic device does not need the second annealing treatment; when the material of the organic layer 230 includes Plexcore® PV 2000, the flexible optoelectronic device is further treated by the second annealing treatment. The temperature of the second annealing treatment is about 155° C.

FIGS. 5A-5D show the open-circuit voltage, the short-circuit current density, the fill factor, and the power conversion efficiency of different flexible optoelectronic devices with time. Different flexible optoelectronic devices are treated by different first annealing treatments at 120° C., 140° C., 160° C. respectively. The annealed flexible optoelectronic devices are unencapsulated and stored under ambient, such that data of performance decay with time can be obtained.

Figure 5B:
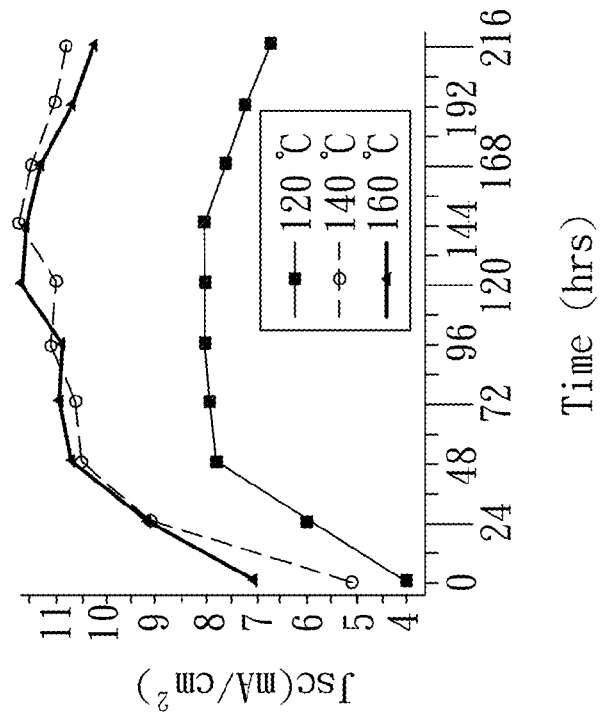
FIGS. 5A-5D show the open-circuit voltage, the short-circuit current density, the fill factor, and the power conversion efficiency of different flexible optoelectronic devices at different times.
Figure 5A:
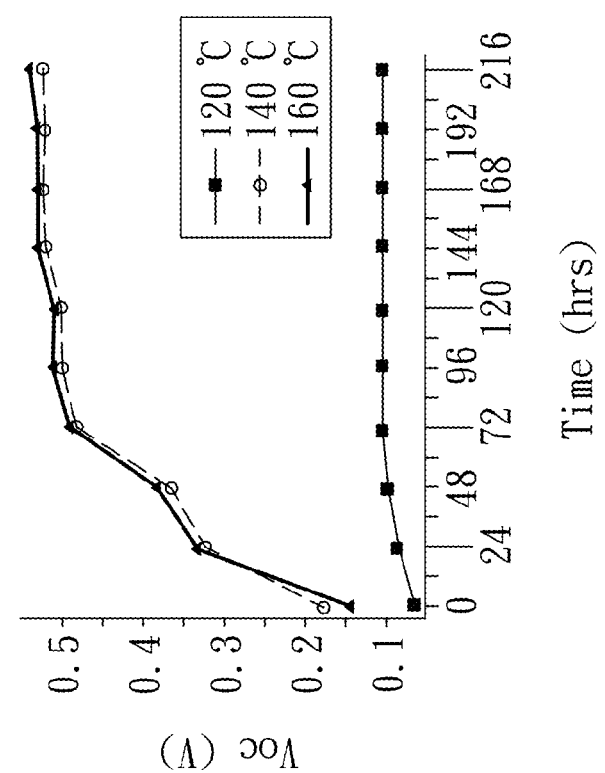

Referring to FIG. 5A, the open-circuit voltage $V_{OC}$ of the flexible optoelectronic device having the ZnO semiconductor layer annealed by the first annealing treatment at 140° C. is increased from 0.17V to 0.48V after 72 hours. The increasing amount is 182%. Moreover, the open-circuit voltage $V_{OC}$ has the highest value of 0.52V at the $144^{th}$ hour.

Referring to FIG. 5B, the short-circuit current density $J_{SC}$ of the flexible optoelectronic device having the ZnO semiconductor layer annealed by the first annealing treatment at 140° C. is increased from 4.6 mA/cm$^2$ to 10.0 mA/cm$^2$ after 48 hours. The increasing amount is 117%. Moreover, the short-circuit current density $J_{SC}$ has the highest value of 11.2 mA/cm$^2$ at the $144^{th}$ hour.

Figure 5D:
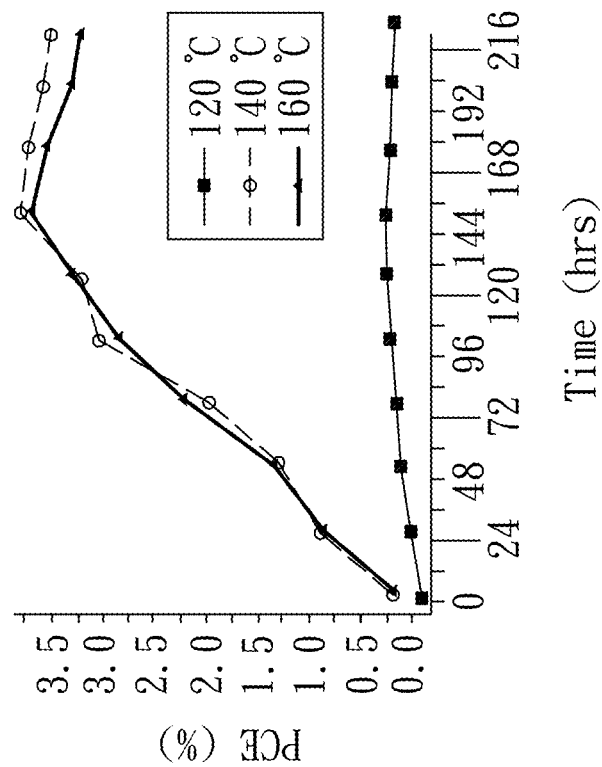
Figure 5C:
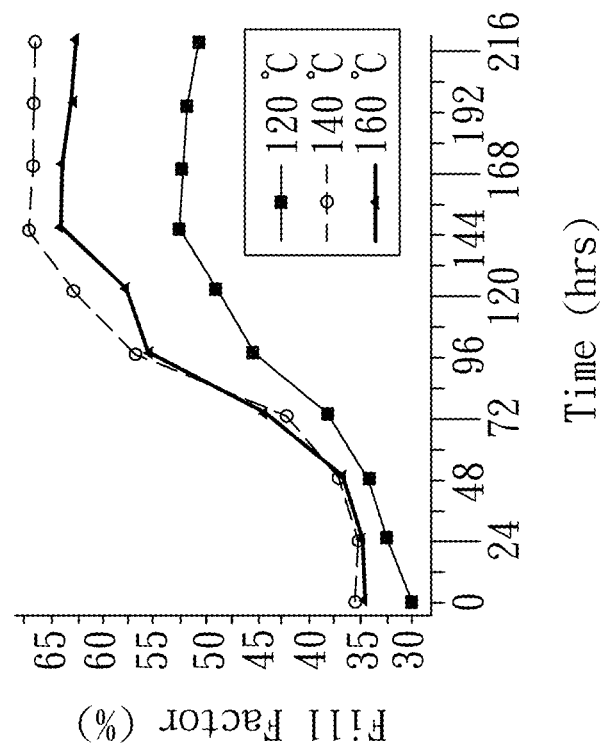

Referring to FIG. 5C and FIG. 5D, the fill factor of the flexible optoelectronic device having the ZnO semiconductor layer annealed by the first annealing treatment at 140° C. is increased from 34.8% to 40.6% between the 0 hour and the $72^{nd}$ hour. The fill factor is increased from 40.6% to 62.8% between the $72^{nd}$ hour and the $144^{th}$ hour. The increasing amount between the $72^{nd}$ hour and the $144^{th}$ hour is more than the increasing amount between the 0 hour and the $72^{nd}$ hour. Moreover, the fill factor has the highest value of 62.8% at the $144^{th}$ hour. Thus, as shown in FIG. 5D, the flexible optoelectronic device has the highest power conversion efficiency of about 3.66% at the $144^{th}$ hour.

Figure 6:
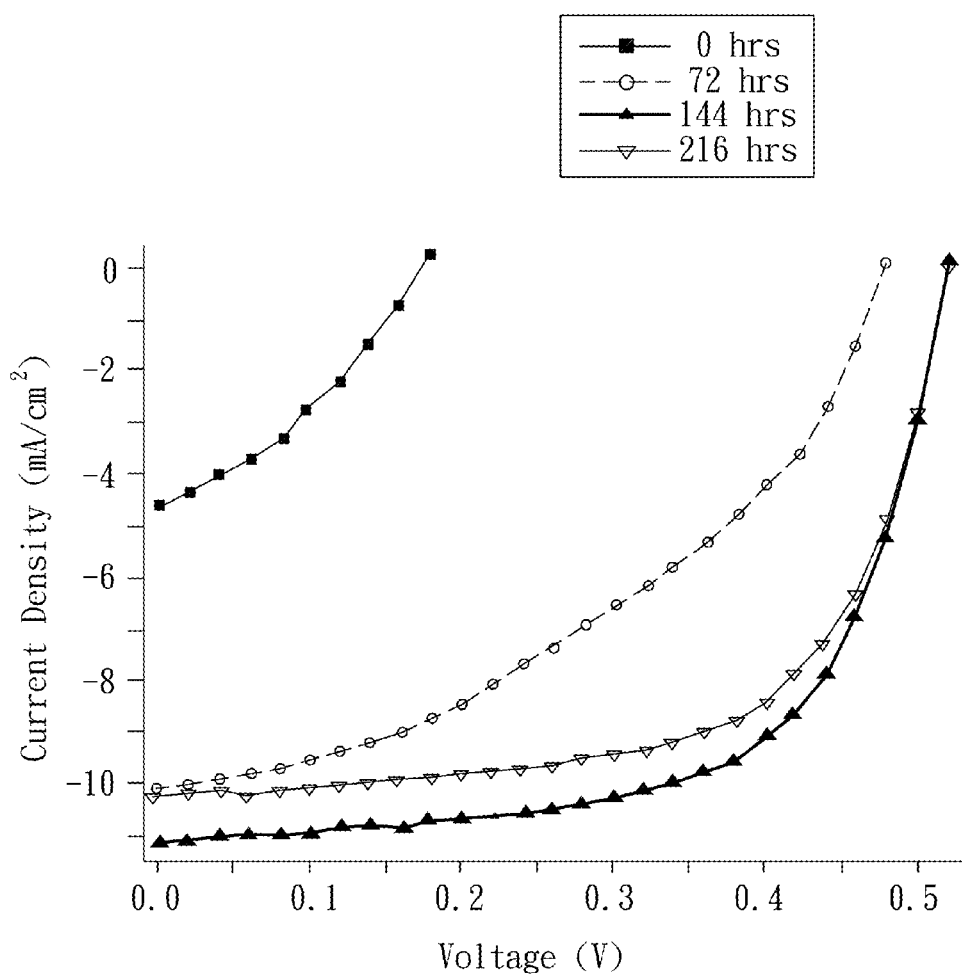
FIG. 6 shows the relationship between current density and voltage of the flexible optoelectronic devices treated by the first annealing treatment at 140° C.
Figure 7A:
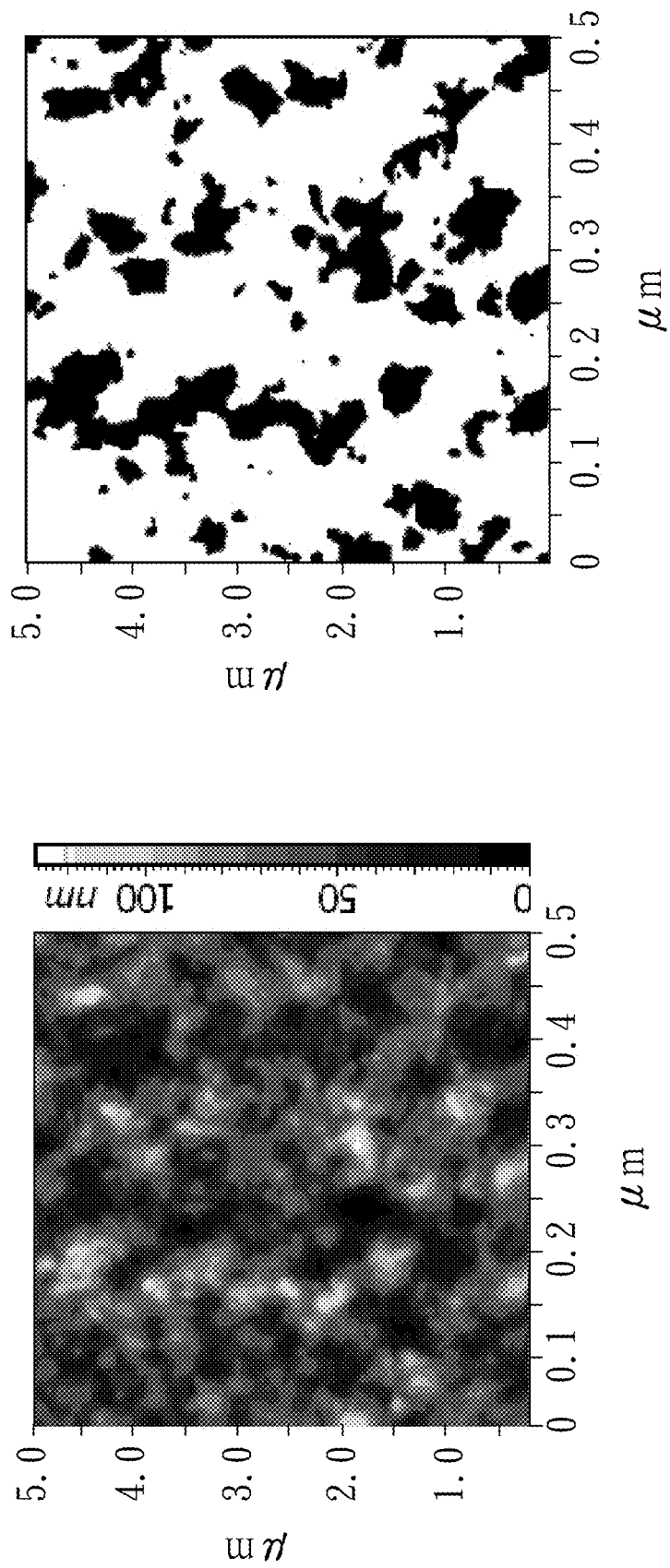
FIGS. 7A-7D show the atomic force microscope images and the grain distributions of the organic layer of the flexible optoelectronic device at different times.
Figure 7B:
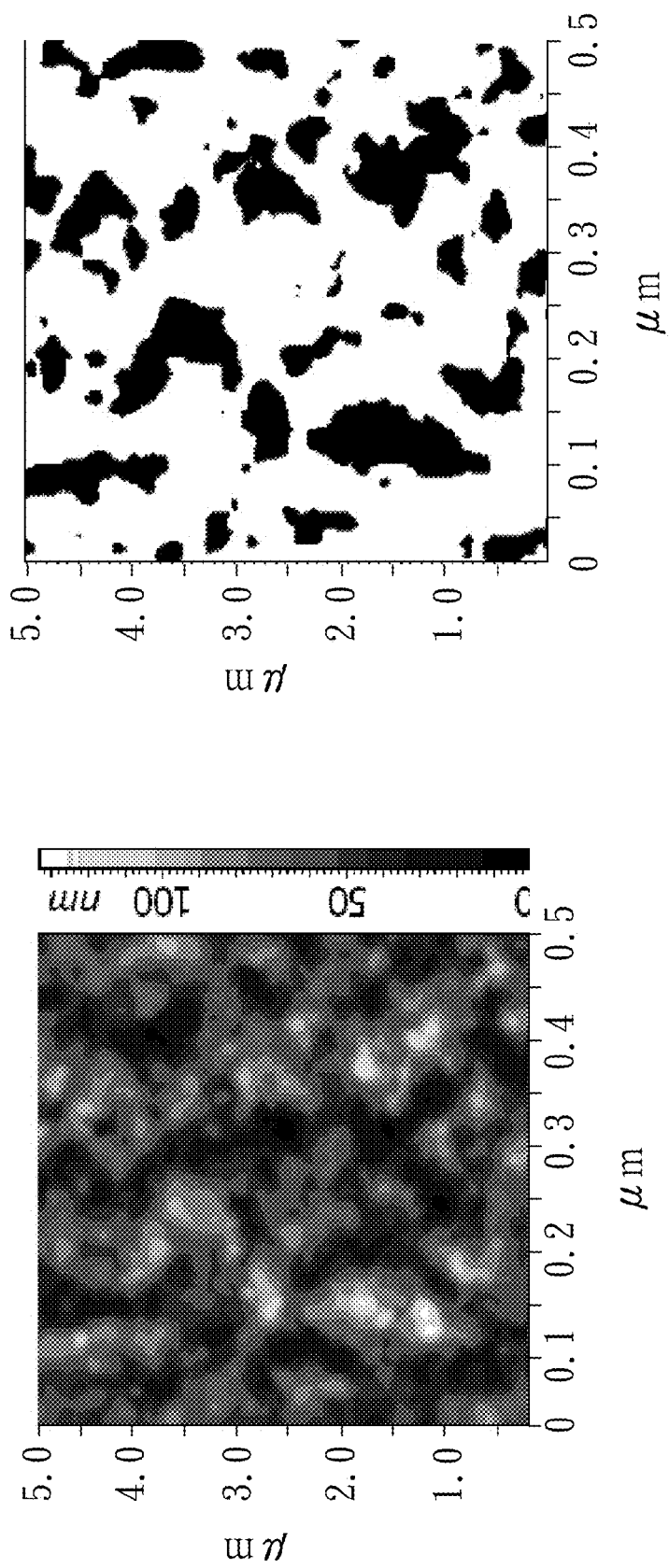
Figure 7C:
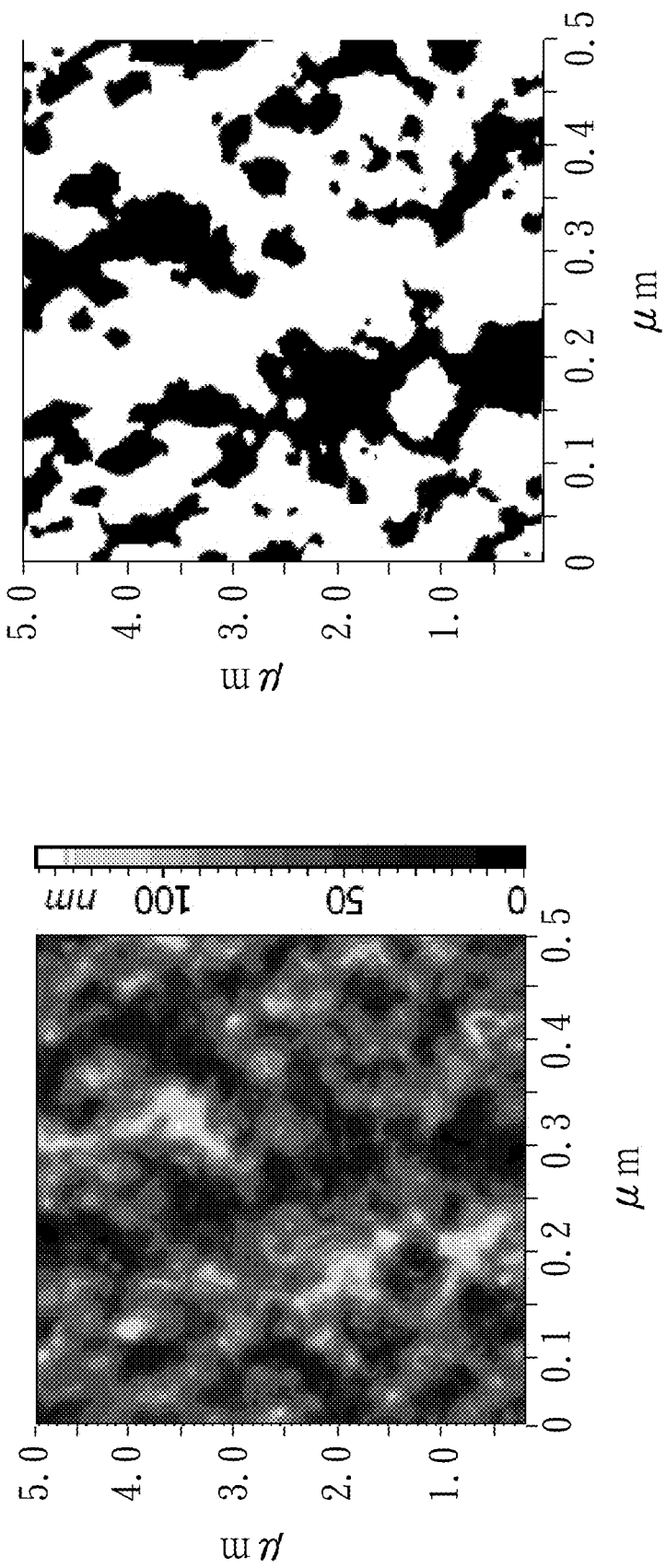
Figure 7D:
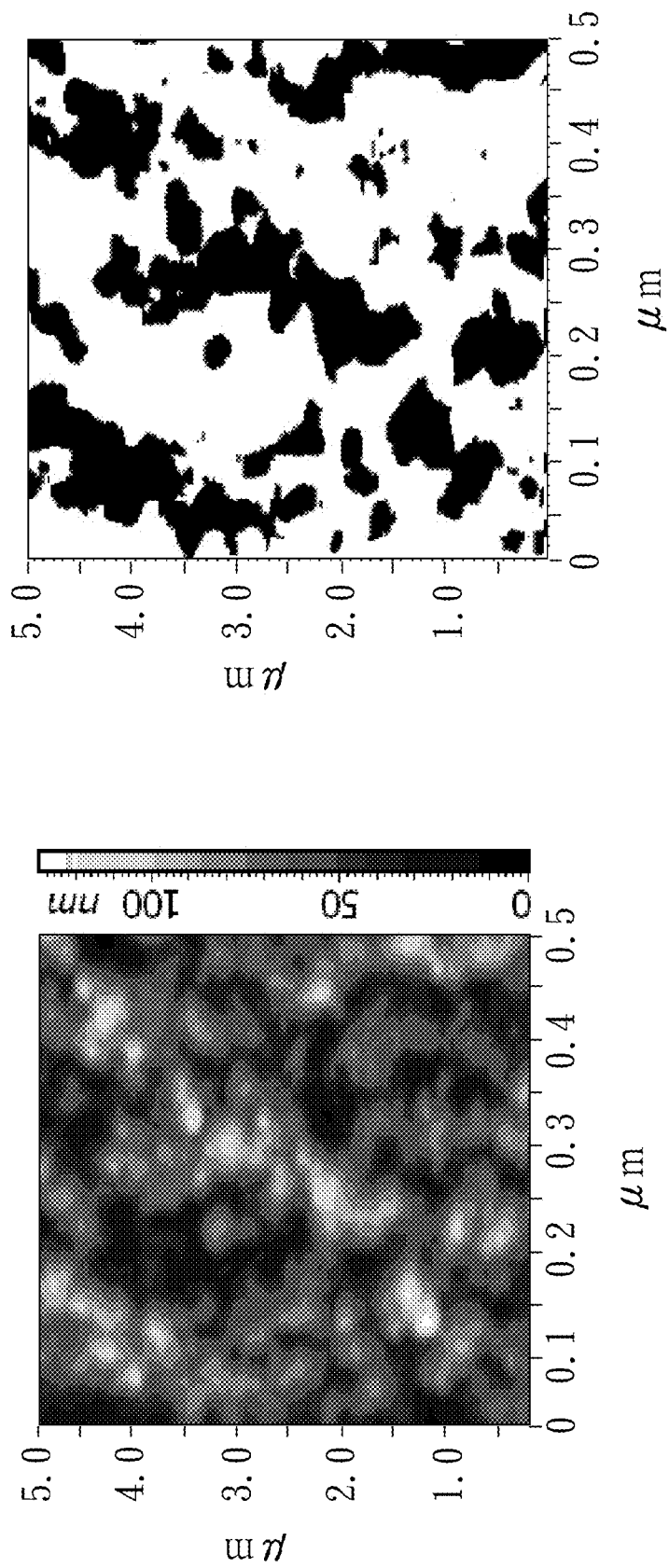

FIG. 6 shows the relationship between current density and voltage of the flexible optoelectronic devices treated by the first annealing treatment at 140° C. The flexible optoelectronic device is unencapsulated and stored under ambient. Between the $72^{nd}$ hour and the $144^{th}$ hour, the shunt resistance Rsh is increased and the series resistance Rs is decreased. Thus, the fill factor and the power conversion efficiency are both increased.

FIGS. 7A-7D show the atomic force microscope images and the grain distributions of the organic layer of the flexible optoelectronic device treated by the first annealing treatment at 140° C. with different times. FIGS. 7A-7D show the atomic force microscope images and the grain distributions of the organic layer of the flexible optoelectronic device at the 0 hour, the $72^{nd}$ hour, the $144^{th}$ hour, and the $216^{th}$ hour respectively.

Figure 8A:
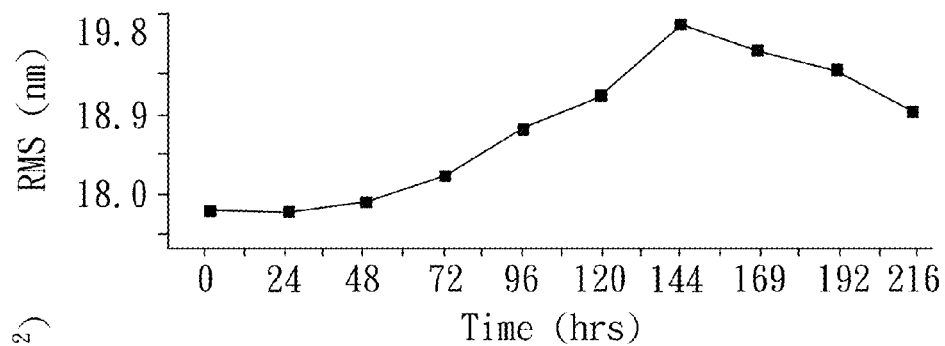
FIGS. 8A-8D show the surface roughness and the average grain area of the organic layer, the shunt resistance and the series resistance of the flexible optoelectronic device at different times.

FIGS. 8A-8D show root mean square roughness, average grain area, shunt resistance, and series resistance of the organic layer of the flexible optoelectronic device treated by the first annealing treatment at 140° C. with different times. Referring to FIG. 8A, the atomic force microscope images show that the root mean square roughness of the organic layer is 17.8 nm at the 0 hour, 18.2 nm at the $72^{nd}$ hour, 19.9 nm at the $144^{th}$ hour, and 18.9 nm at the $216^{th}$ hour respectively. It shows that the surface roughness of P3HT/PCBM is increased from the 0 hour to the $144^{th}$ hour and then decreased from the $144^{th}$ hour to the $216^{th}$ hour.

Figure 8B:
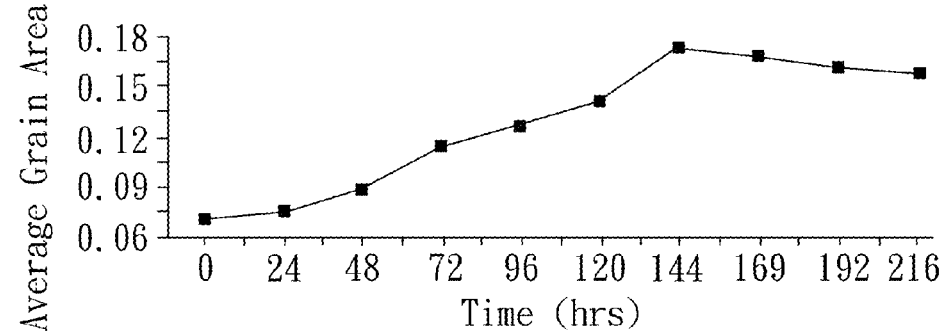

Referring to FIG. 8B, the atomic force microscope images show that the average grain area of the organic layer is 0.071µ m$^2$ at the 0 hour, 0.114µ m$^2$ at the $72^{nd}$ hour, 0.172µ m$^2$ at the $144^{th}$ hour, and 0.158µ m$^2$ at the $216^{th}$ hour respectively. It shows that the average grain area of P3HT/PCBM is increased twice at the $144^{th}$ hour. This is because the P3HT is crystallized as time goes on. Thus, the surface roughness is increased. The crystallinity of the P3HT helps increase the performance of the flexible optoelectronic device.

Figure 8C:
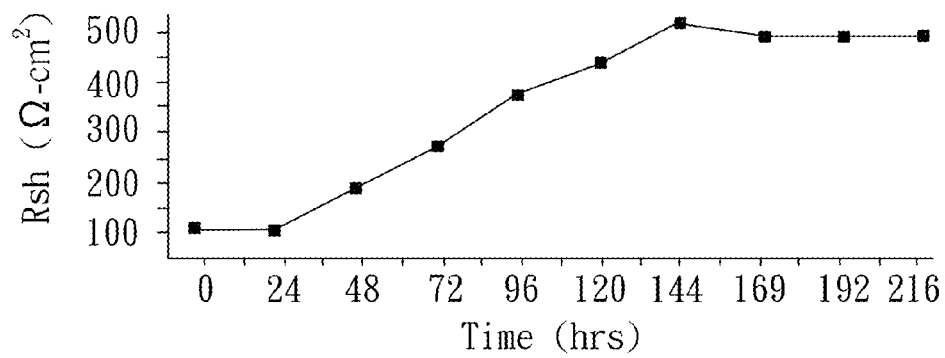
Figure 8D:
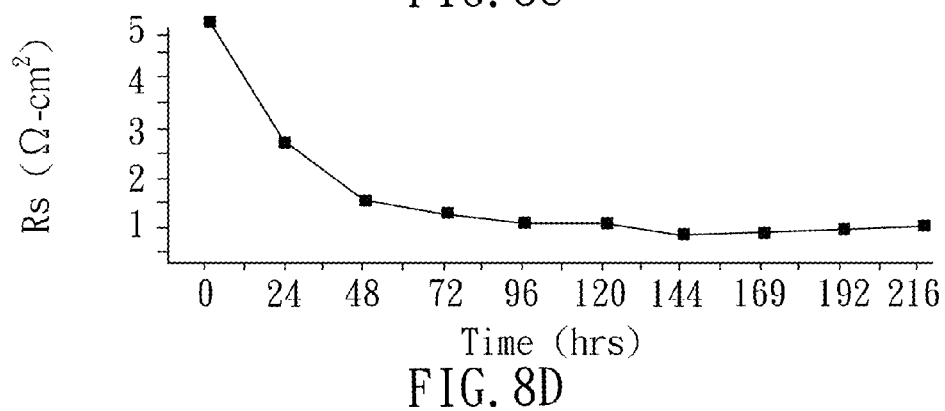

Referring to FIG. 8C and FIG. 8D, with the increases in the surface roughness and the grain size, the contact area between the organic layer and the ZnO semiconductor layer and the contact area between the organic layer and the cathode are both increased, leading to the increased shunt resistance Rsh and the decreased series resistance Rs of the flexible optoelectronic device. As shown in FIGS. 8A-8D, the changes of the shunt resistance Rsh and the series resistance Rs agree with the transformation of the surface roughness and the grain size of the organic layer.

Although specific embodiments have been illustrated and described, it will be appreciated by those skilled in the art that various modifications may be made without departing from the scope of the present invention, which is intended to be limited solely by the appended claims.

What is claimed is:

1. A method of making a flexible optoelectronic device having inverted electrode structure, comprising:
    providing a flexible plastic substrate having a cathode structure;
    forming an n-type oxide semiconductor layer on said cathode structure;
    forming an organic layer on said n-type oxide semiconductor layer;
    forming an anode on said organic layer; and
    forming a hole transporting layer on said organic layer before forming said anode, said anode being formed on said hole transporting layer.

2. The method of making a flexible optoelectronic device according to claim 1, wherein the material of said n-type oxide semiconductor layer comprises at least one material or any combination selected from the group consisting of: tungsten oxide, titanium oxide, and zinc oxide.

3. The method of making a flexible optoelectronic device according to claim 1, wherein the forming method of said n-type oxide semiconductor layer comprises:
    providing a suspension having a plurality of micro/nano n-type transition metal oxide structures; and
    performing a coating process for coating said suspension on the surface of said cathode structure for forming an n-type oxide semiconductor layer on said cathode structure, said n-type oxide semiconductor layer composed of stacked micro/nano n-type transition metal oxide structures, wherein said n-type oxide semiconductor layer is un-annealed.

4. The method of making a flexible optoelectronic device according to claim 3, wherein each ml of said suspension comprises 0.01-100 mg of said micro/nano ti-type transition metal oxide structures.

5. The method of making a flexible optoelectronic device according to claim 1, wherein the forming method of said n-type oxide semiconductor layer is a physical vapor deposition (PVD) process.

6. The method of making a flexible optoelectronic device according to claim 1; wherein the forming method of said n-type oxide semiconductor layer comprises:
    providing a precursor solution having n-type transition metal oxide;
    performing a coating process for coating said precursor solution on the surface of said cathode structure;

performing a sol-gel process for forming an n-type oxide semiconductor layer on said cathode structure from said precursor solution; and performing a first annealing treatment on said n-type oxide semiconductor layer.

7. The method of making a flexible optoelectronic device according to claim 6, wherein the concentration of said precursor solution is about 0.01M-10M.

8. The method of making a flexible optoelectronic device according to claim 6, wherein the temperature of said first annealing treatment is about 140° C.

9. The method of making a flexible optoelectronic device according to claim 1, wherein said flexible optoelectronic device is not treated by a second annealing treatment.

10. The method of making a flexible optoelectronic device according to claim 9, wherein the material of said organic layer comprises polythiophene or its derivatives.

11. The method of making a flexible optoelectronic device according to claim 9, wherein said organic layer comprises poly[3-hexylthiophene-2,5-diyl]/[6,6]-phenyl C61 butyric acid methyl ester (P3HT/PCBM).

12. The method of making a flexible optoelectronic device according to claim 1, further comprising performing a second annealing treatment on said flexible optoelectronic device.

13. The method of making a flexible optoelectronic device according to claim 12, wherein the material of said organic layer comprises Plexcore® PV 2000.

14. The method making of a flexible optoelectronic device according to claim 12, wherein the temperature of said second annealing treatment is about 155° C.

15. The method of making a flexible optoelectronic device according to claim 1, wherein said flexible optoelectronic device is a solar cell, a light-emitting diode, or a light sensor.

* * * * *